(12) United States Patent
Piipponen et al.

(10) Patent No.: US 9,960,748 B2
(45) Date of Patent: May 1, 2018

(54) RF FILTER SUPPRESSION TUNING BASED ON TRANSMIT POWER

(71) Applicant: Provenance Asset Group LLC, Essex, CT (US)

(72) Inventors: Antti Piipponen, Espoo (FI); Toni H. Lähteensuo, Mountain View, CA (US)

(73) Assignee: Provenance Asset Group LLC, Essex, CT (US)

( * ) Notice: Subject to any disclaimer, the term of this patent is extended or adjusted under 35 U.S.C. 154(b) by 224 days.

(21) Appl. No.: 14/793,694

(22) Filed: Jul. 7, 2015

(65) Prior Publication Data

US 2017/0012597 A1 Jan. 12, 2017

(51) Int. Cl.
| | |
|---|---|
| *H03H 7/01* | (2006.01) |
| *H04B 1/44* | (2006.01) |
| *H03H 7/46* | (2006.01) |
| *H04B 1/10* | (2006.01) |
| *H04B 1/12* | (2006.01) |
| *H04B 1/525* | (2015.01) |
| *H04L 5/14* | (2006.01) |
| *H04B 1/401* | (2015.01) |

(52) U.S. Cl.
CPC ........ *H03H 7/0161* (2013.01); *H03H 7/0115* (2013.01); *H03H 7/0153* (2013.01); *H03H 7/1775* (2013.01); *H03H 7/466* (2013.01); *H03H 7/468* (2013.01); *H04B 1/1036* (2013.01); *H04B 1/123* (2013.01); *H04B 1/401* (2013.01); *H04B 1/525* (2013.01); *H04L 5/14* (2013.01); *H03H 2007/013* (2013.01)

(58) Field of Classification Search
CPC combination set(s) only.
See application file for complete search history.

(56) References Cited

U.S. PATENT DOCUMENTS

| | | | | | |
|---|---|---|---|---|---|
| 4,378,532 | A | * | 3/1983 | Burgoon | H03B 5/32 331/116 R |
| 4,438,417 | A | * | 3/1984 | Yamashita | H03H 9/02629 333/193 |
| 7,999,608 | B1 | * | 8/2011 | Groe | H03F 1/223 327/552 |
| 8,736,511 | B2 | | 5/2014 | Morris, III | |
| 8,977,216 | B2 | | 3/2015 | Weissman et al. | |
| 9,350,405 | B2 | * | 5/2016 | Zhu | H04B 1/0458 |
| 2001/0036811 | A1 | * | 11/2001 | Kianush | H03J 5/24 455/41.1 |
| 2005/0215204 | A1 | * | 9/2005 | Wallace | H04B 1/1036 455/78 |
| 2006/0194550 | A1 | | 8/2006 | Block et al. | |

(Continued)

FOREIGN PATENT DOCUMENTS

EP 2747294 A1 6/2014

*Primary Examiner* — Nay A Maung
*Assistant Examiner* — Erica Fleming-Hall
(74) *Attorney, Agent, or Firm* — Dinsmore & Shohl LLP

(57) ABSTRACT

Methods and apparatus, including computer program products, are provided filters. In some example embodiments, there is provided a radio frequency filter including at least one resonant circuit selectable to vary at least the selectivity of the radio frequency filter, wherein the selectivity is varied based on at least one of a first amount of transmit power being used at a user equipment and a second amount of received signal power. Related apparatus, systems, methods, and articles are also described.

19 Claims, 11 Drawing Sheets

(56) References Cited

U.S. PATENT DOCUMENTS

| | | | |
|---|---|---|---|
| 2007/0188260 A1* | 8/2007 | Kawai | H03H 7/38 333/32 |
| 2007/0190965 A1* | 8/2007 | Schilling | H04W 52/08 455/401 |
| 2008/0081589 A1* | 4/2008 | Kuo | H04B 1/18 455/313 |
| 2010/0253442 A1* | 10/2010 | Mu | H03J 3/20 333/17.1 |
| 2010/0277289 A1* | 11/2010 | Brauner | G06K 7/10336 340/10.51 |
| 2011/0199168 A1* | 8/2011 | Kadota | H03H 9/02559 333/195 |
| 2012/0147929 A1* | 6/2012 | Malaga | H04B 1/0014 375/147 |
| 2013/0222077 A1* | 8/2013 | Ota | H03H 9/0576 333/133 |
| 2013/0241666 A1 | 9/2013 | Granger-Jones et al. | |
| 2014/0227981 A1* | 8/2014 | Pecen | H01Q 1/52 455/77 |
| 2014/0269868 A1* | 9/2014 | Werner | H04B 3/54 375/224 |
| 2015/0049651 A1* | 2/2015 | Hariharan | H04L 5/1461 370/278 |
| 2015/0065070 A1 | 3/2015 | Maxim et al. | |
| 2015/0188601 A1* | 7/2015 | Onaka | H04B 1/48 455/83 |
| 2016/0352368 A1* | 12/2016 | Khlat | H04B 1/1027 |

\* cited by examiner

RF FILTER SUPPRESSION TUNING BASED ON TRANSMIT POWER

FIELD

The subject matter disclosed herein relates to filters.

BACKGROUND

As cellular and wireless becomes a more integral part of everyday life, cellular user equipment may be expected to provide more capabilities throughout the world. As a consequence, the user equipment may be expected to operate over a wider portion of the radio frequency (RF) spectrum. Although this may seem like a relatively straightforward function, configuring the user equipment to be able to tune over different portions of the RF spectrum presents new challenges to cellular manufacturers.

SUMMARY

Methods and apparatus, including computer program products, are provided filters.

In some example embodiments, there is provided a radio frequency filter including at least one resonant circuit selectable to vary at least the selectivity of the radio frequency filter, wherein the selectivity is varied based on at least one of a first amount of transmit power being used at a user equipment and a second amount of received signal power. In some example embodiments, one of more variations may be made as well as described in the detailed description below and/or as described in the following features. The at least one resonant circuit may be selected to suppress transmit signals in a stopband outside a passband of the radio frequency filter, when the user equipment is in a high power transmission state. The at least one resonant circuit is not selected, when the user equipment is in a low power transmission state. The radio frequency filter may include a tunable radio frequency bandpass filter, a tunable duplex filter, a tunable radio frequency lowpass filter, a tunable radio frequency highpass filter, or any combination thereof. The radio frequency filter may include a transmit filter including an output and an input, wherein the output is coupled to an antenna and the input is coupled to a power amplifier. The radio frequency filter may include a receive filter including an output and an input, wherein the input is coupled to an antenna and the output is coupled to a low noise amplifier. A controller may be configured to at least determine the first amount of transmit power and/or the second amount of receive power and select, based on the first amount and second amount, the at least one resonant circuit. The transmit power may be determined from an indication sent by a base station to the user equipment. The controller may select the at least one resonant circuit by closing a switch. The controller may select the at least one resonant circuit, when transmission is inhibited and reception is enabled. The controller may select the at least one resonant circuit based on a comparison of the first amount of transmit power to a plurality of threshold transmit powers, wherein the threshold transmit powers are mapped to a corresponding selectivity required at the radio frequency filter. The at least one resonant circuit may include at least one of an inductor, a capacitor, and an acoustic wave filter. The at least one resonant circuit may include at least one inductor in series with at least one capacitor. The at least one resonant circuit may include at least one inductor in parallel with at least one capacitor. The least one resonant circuit may be coupled in series to at least one coupling capacitor. The at least one capacitor and the at least one coupling capacitor may include at least one variable capacitor under the control of the controller. The high power transmission state may transmit at a higher power than the low power transmit state.

It is to be understood that both the foregoing general description and the following detailed description are exemplary and explanatory only and are not restrictive. Further features and/or variations may be provided in addition to those set forth herein. For example, the implementations described herein may be directed to various combinations and subcombinations of the disclosed features and/or combinations and subcombinations of several further features disclosed below in the detailed description.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the subject matter disclosed herein. In the drawings.

Figure 1:
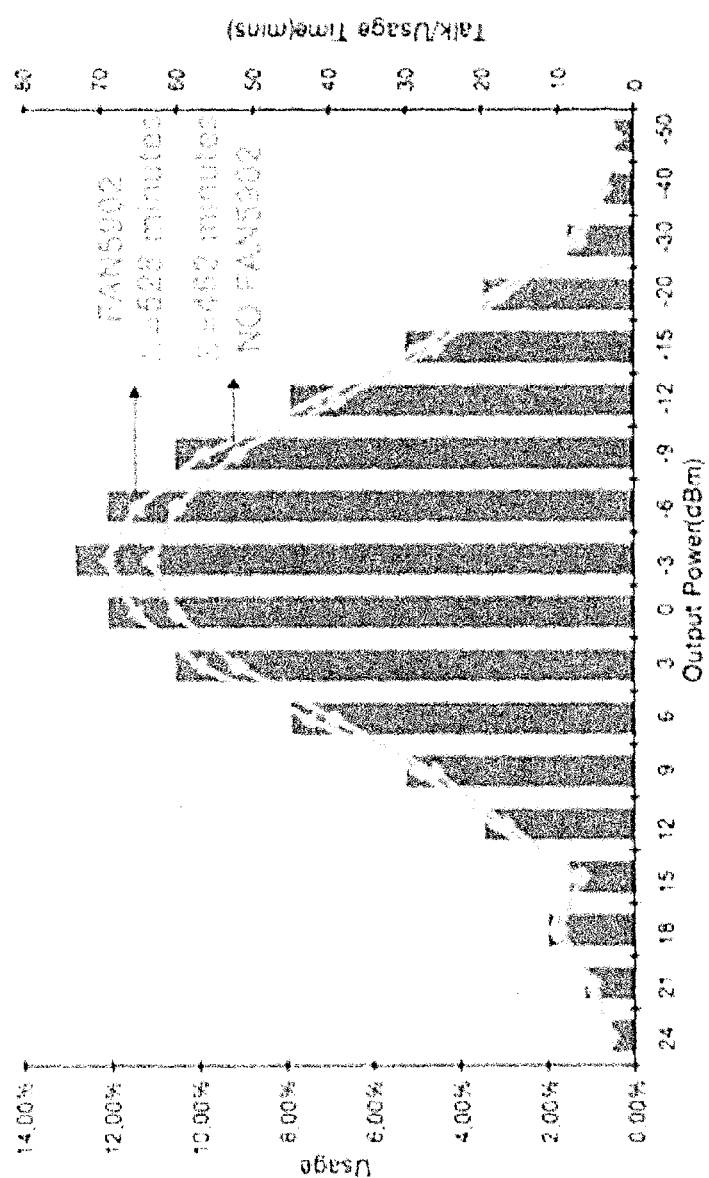
FIG. 1 depicts an example of power use by a cellular radio, in accordance with some example embodiments.

Like labels are used to refer to same or similar items in the drawings.

DETAILED DESCRIPTION

RF front-ends may include filters, such as acoustic filters including surface acoustic wave (SAW), bulk acoustic wave (BAW), and/or other filter types. The isolation and frequency passbands of these filters may be specified stringently in order to comply with regulations that govern RF spectrum management in many parts of the world.

In the case of cellular frequency division duplex (FDD) systems for example, there can be very stringent radio operating conditions for transmit and receive filters. The reference sensitivity test is an example of a test performed on a user equipment to ensure this stringent compliance. The reference sensitivity test is performed with the transmit signal at full output power, while having the received signal at minimum power but still having sufficiently few errors (for example, at or below a threshold error rate). In this reference sensitivity test, the receiver at the transceiver may encounter various types of noise including interference caused by the transmit signal. For example, the transmit signal may couple into the receiver via components at the transceiver as well as via an antenna. In any case, this noise may increase the receiver noise floor and desensitize the receiver.

With respect to wideband frequency noise, this may be dependent on at least the frequency selectivity of the transmit filter. For example, a more selective, sharper transmit filter may be used to provide the selectivity needed to suppress noise (which is caused by the transmitter) in the receive band(s) used by the receiver. However, this increase in selectivity may come at the expense of higher insertion loss. On the receiver side, the receive filter should also have low insertion loss and provide suppression of signals in the transmit frequency band.

To achieve good selectivity in filters, passband insertion loss may be sacrificed to achieve the suppression needed for the high power transmit signal, such as the receiver sensitivity test noted above as well as other high power states. However in most types of radios, it may not be typical for the transmit signal power to be at a maximum level. For example, in the case of a user equipment such as a cell phone and/or the like, the maximum output power may be about 24 dBm at certain times, but during most of the operating time the output power is about 0 dBm or less. FIG. 1 depicts an example plot for a user equipment. As can be seen in FIG. 1, most of the time, the user equipment operates around −3 dBm (see center portion of bell curve). During this low power operating mode/state, the user equipment's out-of-band signal transmissions (which affect the receiver) may also be weaker and thus require less suppression by the transmit filter. As such, during these low power times when the transmit signal is not operating at a maximum or high transmit power, the filter may be configured as a less selective filter providing less suppression to the out-of-band transmit signals. Furthermore, the receive filter may be configured as a less selective filter providing less suppression to the transmit signal.

In some example embodiments, there is provided an RF filter having a selectable suppression in the stopband. Moreover, the amount of suppression may be selected based on the output power of the transmit signal and/or self-interference at the receiver. In some example embodiments, the RF filter having selectable suppression may also be a bandpass filter tunable over a range of RF frequencies. In some example embodiments, the tunable RF filter having selectable suppression may include a plurality of filter stages, which can be switched in, or out of, the RF filter to tune the suppression. For example, a controller may determine that a radio transceiver may transmit at a high power such as the maximum power state noted above and/or some other high power transmit state. When this is the case, the controller may configure the RF filter to provide for example a $5^{th}$ order passband filter having sufficient stopband attenuation in the receive band to suppress interference from the transmit signal. When the controller determines that the radio transceiver may transmit at a lower power, the controller may configure the RF filter to provide less than the $5^{th}$ order passband filter, such as a $3^{rd}$ order passband filter for example. As such, the RF filter can vary the selectivity (for example, Q or roll off) of the filter, which changes the amount of suppression and insertion loss. In the previous example, the change from the $5^{th}$ order transmit filter to a $3^{rd}$ order transmit filter may reduce the suppression provided in the adjacent receive band(s), but as noted, this reduction may be tolerated given that the transmitter is operating at a lower transmit power. And, the change from the $5^{th}$ order filter to the $3^{rd}$ order filter may also reduce the filter's insertion loss.

In some example embodiments, the RF filter having a tunable quantity of resonator stages may be considered a tunable RF filter. In some example embodiments, the tunable RF filter can be tunable with respect to having a tunable quantity of resonator stages (and thus selectivity and suppression), but tunable RF filter may not tunable with respect to frequency range. When this is the case, a center frequency of the tunable RF filter cannot be tunable across a range of frequencies or bands. However, in some example embodiments, the tunable RF filter (which is tunable with respect to having a tunable quantity of resonator stages) may also be tunable with respect to frequency range.

Although the previous example described configuring the tunable RF filter between a maximum power transmit mode having a $5^{th}$ order filter and a lower power mode having a $3^{rd}$ order filter, the tunable RF filter having selectable suppression may operate with other power modes and other filter orders as well. For example, the controller may adjust the stages of the transmit filter with a higher granularity, selecting any of the stages between 1 and 5 depending on the expected transmit power. Although some of the examples refer to the filter having selectable suppression operating as a transmit passband filter, the filter having selectable suppression may be used at other locations including the receiver as well.

Figure 2A:
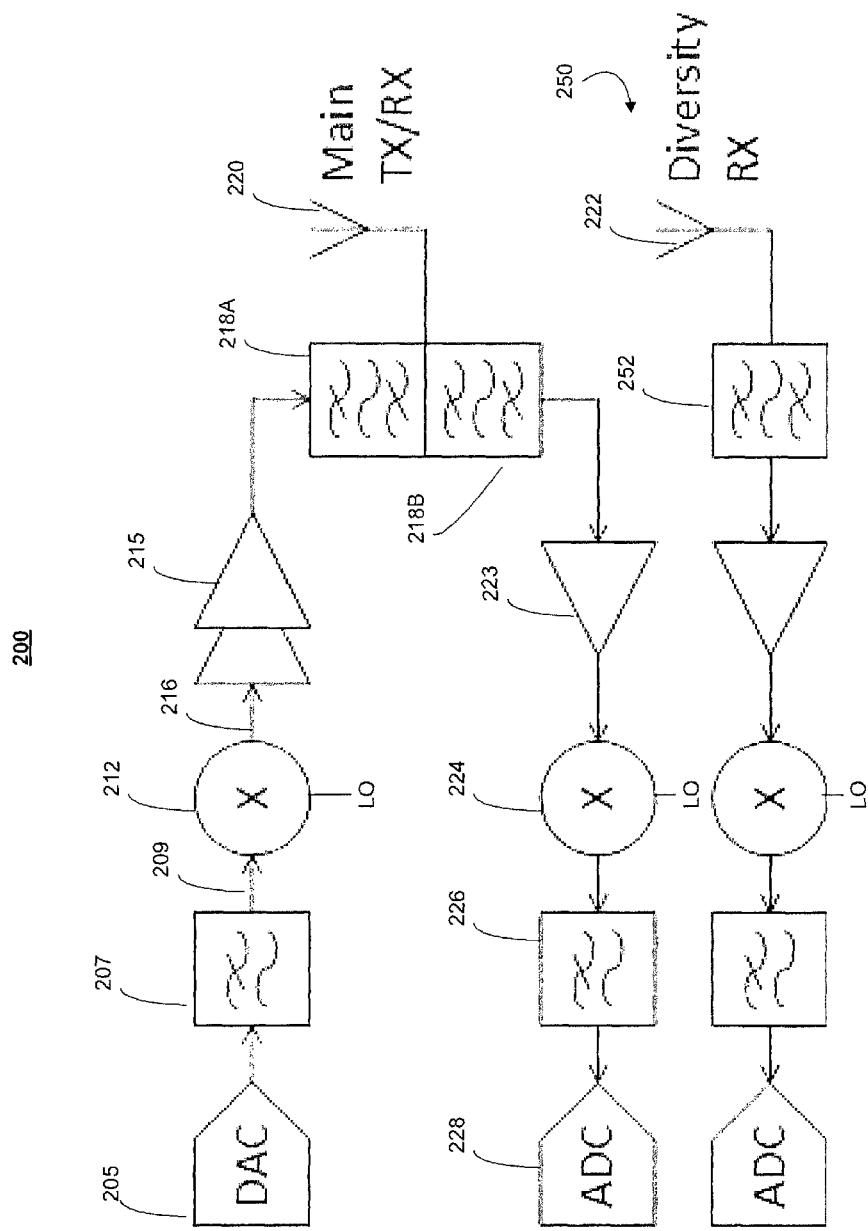
FIG. 2A depicts an example radio frequency (RF) front-end, in accordance with some example embodiments.

FIG. 2A depicts an example radio transceiver front end, in accordance with some example embodiments.

Although FIG. 2A depicts a frequency division duplex (FDD) transceiver including diversity, this is merely an example as other types of radio transceivers including tunable RF filters having selectable stopband suppression may be used as well.

Digital-to-Analog converter (DAC) 205 may convert digital samples to provide an analog output waveform. Next, low-pass filter 207 may receive the analog output waveform from coupled DAC 205. Low-pass filter 207 may filter the analog output waveform by at least suppressing for example DAC harmonic components at one or more multiples of the DAC sampling frequency. The low-pass filter's 207 output signal 209 may then be upconverted by a mixer 212 to a desired RF carrier frequency 216. The upconverted modulated signal 216 (which carries the digital samples) may then be provided to transmit amplifier 215 to obtain a desired transmit power level. Next, the amplifier output signal may be provided to a filter, such as a duplex filter 218A-B, which is further coupled to at least one antenna.

The duplex filter may include a transmit filter 218A providing a passband to allow transmission of the amplifier 215 output signal, and the duplex filter may also include a receive filter 218B providing a passband to allow reception of receive signals provided by antenna 220 for example. The duplex filter may have selectable suppression as disclosed herein, and may also be tunable over a range of frequencies. Duplex filter 218A-B may be duplex in the sense that it includes a transmit passband filter 218A and a receive passband filter 218B. Duplex filter may include a switch to couple the antenna 220 to the appropriate filter 218A-B.

In some example embodiments, duplex filter 218A-B may be configured to have selectable selectivity and thus suppression in the stopband. In some example embodiments, transmit filter 218A may include a plurality of filter stages that can be switched in, or out of, transmit filter 218A.

Moreover, receive filter 218B may include a plurality of filter stages that can be switched in, or out of, receive filter 218B.

With respect to the receiver, receive signals may be obtained from at least one of the antenna 220 and 222 (for example, antenna 220 and/or antenna 222). The received signals may be at a different frequency than the transmit signal. As such, duplex filter 218A may have a passband that allows the transmit signal to pass with a selectivity that suppresses signals in the adjacent stopband (which corresponds to the receive band). Duplex filter 218B may have a passband that allows the receive signal (which is obtained from the antenna(s)) at a different frequency to pass, while suppressing any interfering transmit signals that may be present outside the passband (for example, in the adjacent transmit band). An example of a duplex filter frequency response is described further with respect to FIG. 2B below. The receive filter 218B of the duplex filter may thus allow the desired receive signal (which may include some residual interference) to pass to an amplifier, such as low-noise amplifier 223. The amplifier 223 output may then be downconverted at mixer 224 to a lower frequency, such as baseband, and filtered by low pass filter 226 before being processed by analog to digital converter (ADC) 228. Low pass filter 226 may suppress interference to a level that can be handled by the analog to digital converter 228. The analog to digital converter output may also be provided to a modem for further processing. FIG. 2A also shows a separate receiver chain 250, which may be used for diversity reception mode, although the system 200 may be implemented without the diversity receiver chain 250.

In duplex filter 218A-B, a portion of the transmit signal may couple through to the receiver's low noise amplifier 223. For example, the high power transmit signal (which is output by amplifier 215) may couple from the transmit side of the duplex filter 218A to the receive side of the duplex filter 218B. Moreover, a portion of the transmit signal may also couple into the receive chain 250 via the diversity receive antenna 222. A function of the RF filters 218A-B and 252 may be to mitigate this interference from this transmit signal coupling.

The duplex filter 218A-B and the bandpass filter 252 may be, as noted, implemented as tunable RF filters. Moreover, these tunable filters may be implemented as acoustic type filters, such as surface acoustic wave (SAW) resonator filters, film bulk acoustic wave (FBAW) resonator filters, and/or the like.

Although FIG. 2A depicts system 200 with a certain configuration of components, system 200 may include additional components as well. For example, in the case of a user equipment such as a cell phone and/or the like, there may be additional RF front end components, such as switches (for selecting the correct power amplifier, RF filter, and/or the like), diplexers (for example, to allow inter-band carrier aggregation), and/or other components.

Figure 2B:
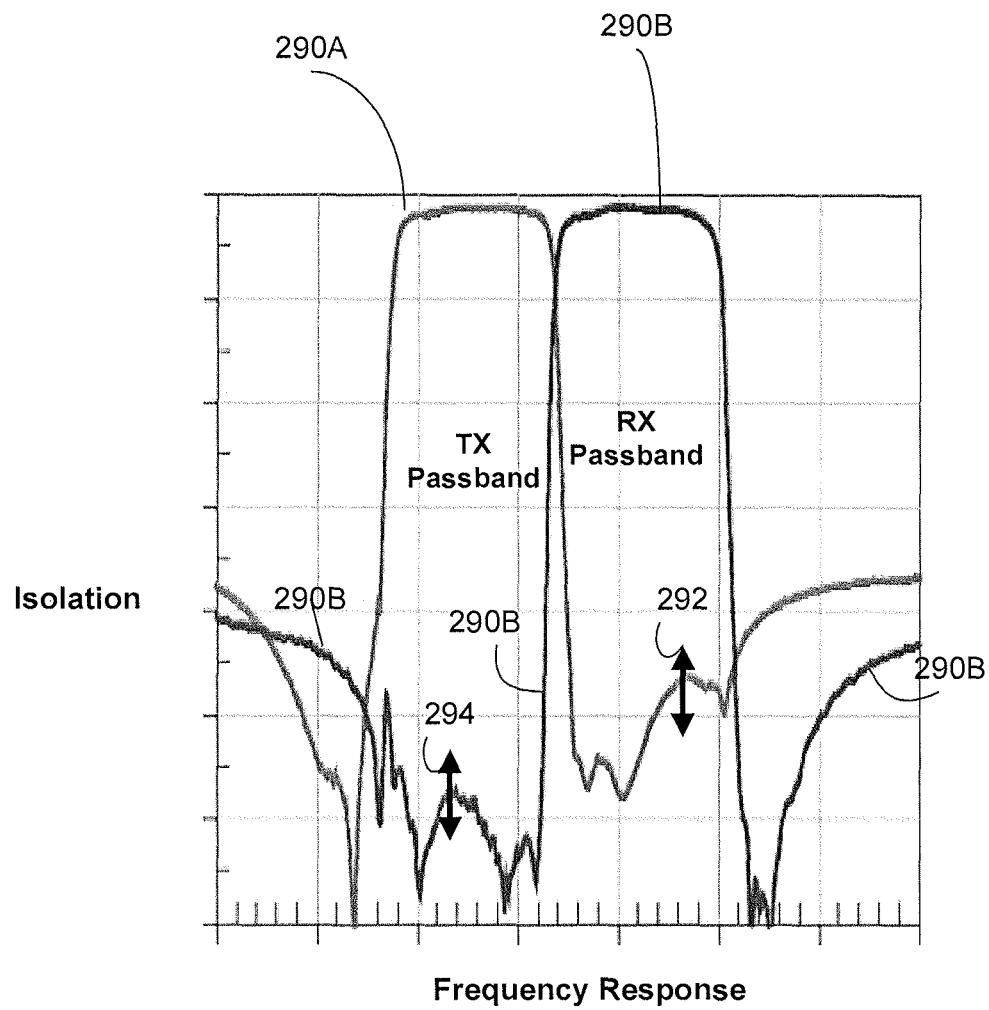
FIG. 2B depicts an example of a duplex filter, in accordance with some example embodiments.

FIG. 2B depicts an example frequency response for a duplex filter which may be tunable over a range of frequencies. In the example of FIG. 2B, the transmit filter 218A may correspond to 290A, and the receive filter 218B may correspond to 290B. In accordance with some example embodiments, the center frequency of the passbands may be tuned in frequency to enable reception and/or transmission over different frequencies. Moreover, the selectivity may be configured to adjust the suppression in the adjacent band stop regions. For example, transmit filter 318A may be configured to have a sharper roll off (for example, more selectable) or a more gradual roll off (for example, less selectable) by for example adjusting the stages of filter 318A. This adjustment may vary the suppression 292 provided in the adjacent stopband that overlaps with the receive filter's band. Likewise, receive filter 318B may be configured to have a sharper roll off or more gradual roll off by for example adjusting the quantity of stages at filter 318B. And, this adjustment may also vary the suppression 294 provided in the adjacent stopband that overlaps with the transmit filter's band.

Figure 3A:
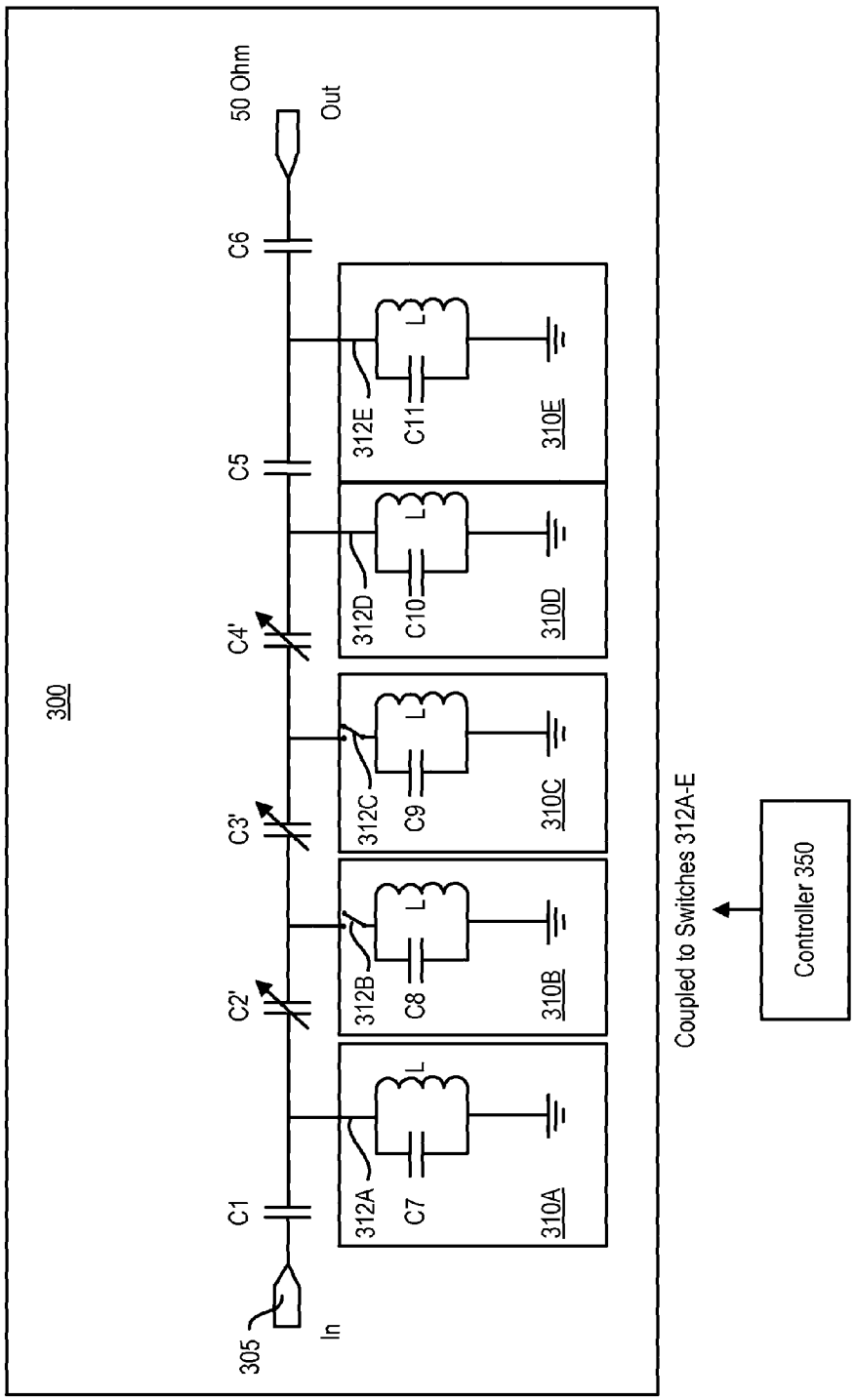
FIG. 3A depicts an example of a filter, in accordance with some example embodiments.

FIG. 3A depicts an example filter 300, in accordance with some example embodiments. Filter 300 may be used at duplex filter 218A, 218B, and/or filter 252 for example, although filter 300 may be used in other locations and in other types of radios as well.

Figure 3B:
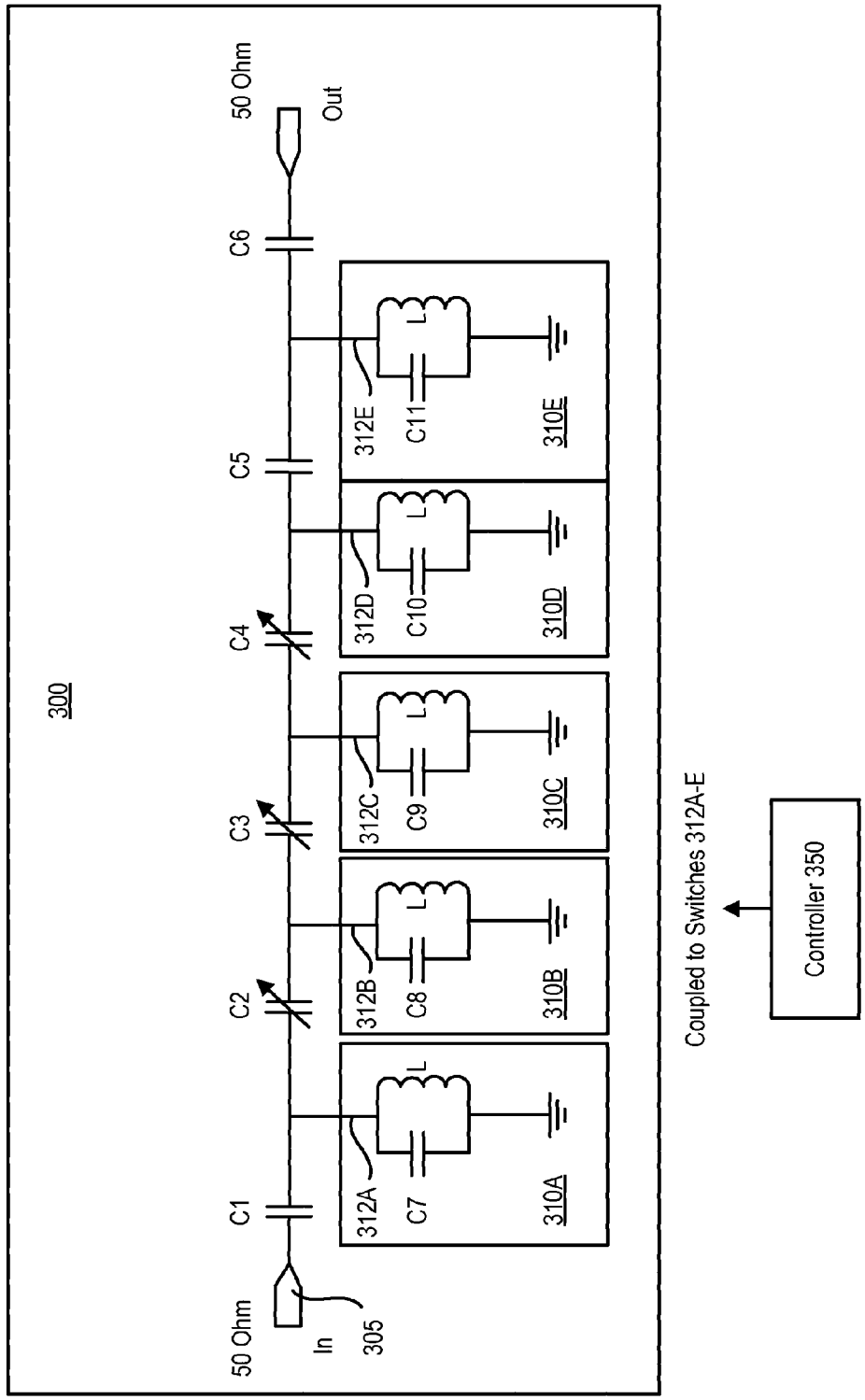
FIG. 3B depicts the filter of FIG. 3A in a different configuration, in accordance with some example embodiments.
Figure 4A:
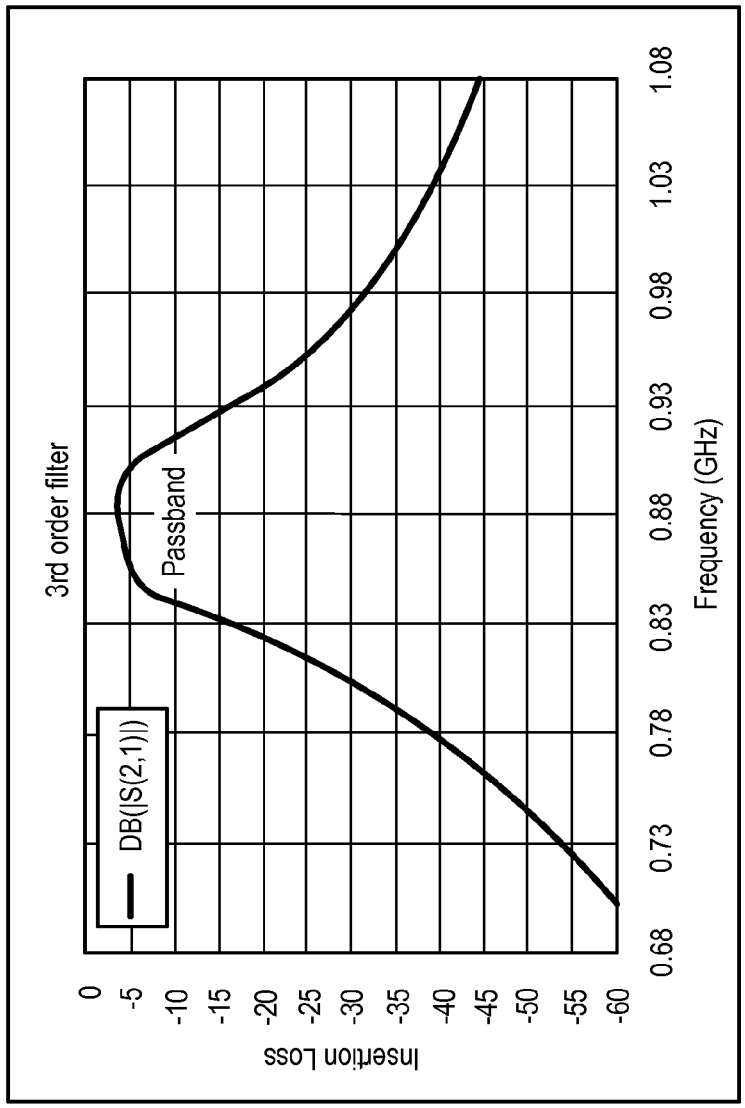
FIGS. 4A-4B depict example frequency responses of a transmit portion of a duplex filter, in accordance with some example embodiments.
Figure 4B:
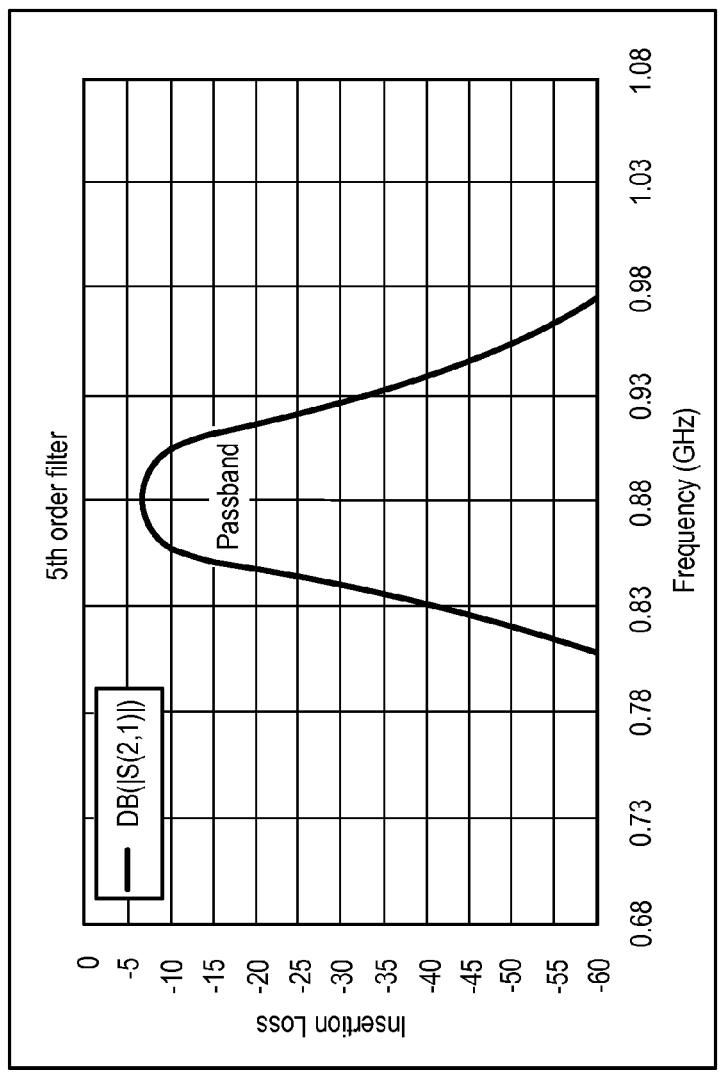

The filter 300 may include an input 305 coupled to one or more filter stages 310A-E comprising resonator circuits. These resonator circuits may be switched in (or out) by switches 312A-E for example based on transmit power and/or receiver self-interference. In the example of FIG. 3A, switches 312A, D, and E are closed to provide a $3^{rd}$ order bandpass filter having a frequency response as shown at FIG. 4A. FIG. 3B depicts filter 300 having switches 312A-E all closed to provide a $5^{th}$ order bandpass filter having a frequency response as shown at FIG. 4B. By varying the configuration of the filter 300, the filter is configured to effectively vary the attenuation provided at the adjacent stopband(s) by virtue of changing the selectivity/roll off for example.

In some example embodiments, capacitors (C1-C6) may be used to couple the resonant circuits 310A-B. Moreover, one or more of the capacitors C1-C6 may be variable capacitors that can be varied to change the passband bandwidth of the filter 300. While capacitors C7-C11 (one or more of which may also be variable) may also be varied to adjust the center frequency of the filter 300. The capacitor tuning may be performed by the controller 350. For example, when the controller 350 switches each of resonators 310A-B in or out, the controller 350 may also tune one or more of capacitors C1-C6 to adjust the passband bandwidth, and controller 350 may also tune one or more of capacitors C7-C11 to adjust the center frequency of the filter 300.

In addition to varying the filter stopband attenuation, filter 300 may also be tunable over a frequency range using inductive capacitive (LC) resonator circuits, in accordance with some example embodiments. To adjust the center frequency of the tunable RF filter (which also varies the passband and corresponding stopband), the resonator(s) may be tuned by for example varying at least one of the inductors (labeled L) or at least one of capacitors (labeled C1-C6). For example, a capacitor bank or other like variable capacitor can be used to vary the amount of capacitance to adjust the filter center frequency. Likewise, an inductor bank or other like variable inductor can be used to vary the amount of inductance to adjust the filter center frequency.

To illustrate by way of an example, a radio, such as system 200, may be in a mode where a high amount of transmit power is being used while the radio's receiver is also in operation. When this is the case, a controller 350 may determine that a high power transmit mode is being initiated, and close switches 312A-E to provide for example the $5^{th}$ order bandpass filter having a high Q and having a substantial amount of stopband attenuation in the receiver's passband. For example, filter 300 may correspond to transmit filter 218A of the duplex filter 218A-B, and provide a stopband attenuation in the receive filter's 218B passband. As can be seen by FIG. 4B, transmit filter 218A when configured as the $5^{th}$ order filter can provide a more selective filter, when compared to the $3^{rd}$ order filter of FIG. 4A. When the radio determines that it is in a mode in which a lower amount of transmit power can be used, controller 350 may open switches 312 B and C to configure the filter 300 to be less selective (for example, have a lower Q), which in this example configures transmit filter 218A as a $3^{rd}$ order bandpass filter. FIG. 4A depicts an example of the $3^{rd}$ order bandpass filter frequency response. As shown at FIG. 4A, the less selective $3^{rd}$ order bandpass filter may provide less stopband attenuation in the receive filter's passband, when compared to the $5^{th}$ order filter. This decrease on in the stopband attenuation (which is possible due in part to the lower transmit power) can reduce the amount of insertion loss caused by filter 300.

In some example embodiments, the filter 300 may be implemented as a transmit passband filter, such as filter 218A. When this is the case, the controller 350 may evaluate one or more of the following to determine how to configure the stopband suppression of the transmit filter: an amount of transmit output power; an amount of wideband transmit noise across a receive band; an amount of harmonic frequency suppression in stopbands; and/or an amount of suppression at other frequencies such as protected frequencies or other interfering signal frequencies (which may be based on transmit output power). For example, one or more of these amounts may be compared to threshold values to determine what filter order to operate with. Alternatively or additionally, these values may be used as an input to a function or table that provides filter order to operate with given the input values.

In some example embodiments, the filter 300 may be implemented as a receive passband filter, such as filter 218B or 252. When this is the case, the controller 350 may evaluate one or more of the following to determine how to configure the stopband suppression of the receive filter: an amount of transmit output power; an amount of suppression of the transmit signal; an amount of suppression of half-duplex or full-duplex interfering signals; and/or an amount of suppression of other known interfering signals or harmonics thereof. For example, one or more of these amounts may be compared to threshold values to determine what filter order to operate with. Alternatively or additionally, these values may be used as an input to a function or table that provides filter order to operate with given the input values.

In some example embodiments, the filter 300 may be configured to provide, whenever possible, lower stopband suppression. One or more of the tunable resonator stages 310A-E may be bypassed as the controller switches the resonator stages in or out of the filter. Lower insertion loss may also provide improved transmit efficiency (for example, smaller losses between the power amplifier and antenna) and improved receiver sensitivity (for example, smaller losses between antenna and the first low-noise amplifier). Although FIG. 3A-3B depicts 5 stages, other quantities of resonator stages may be used as well.

Figure 4C:
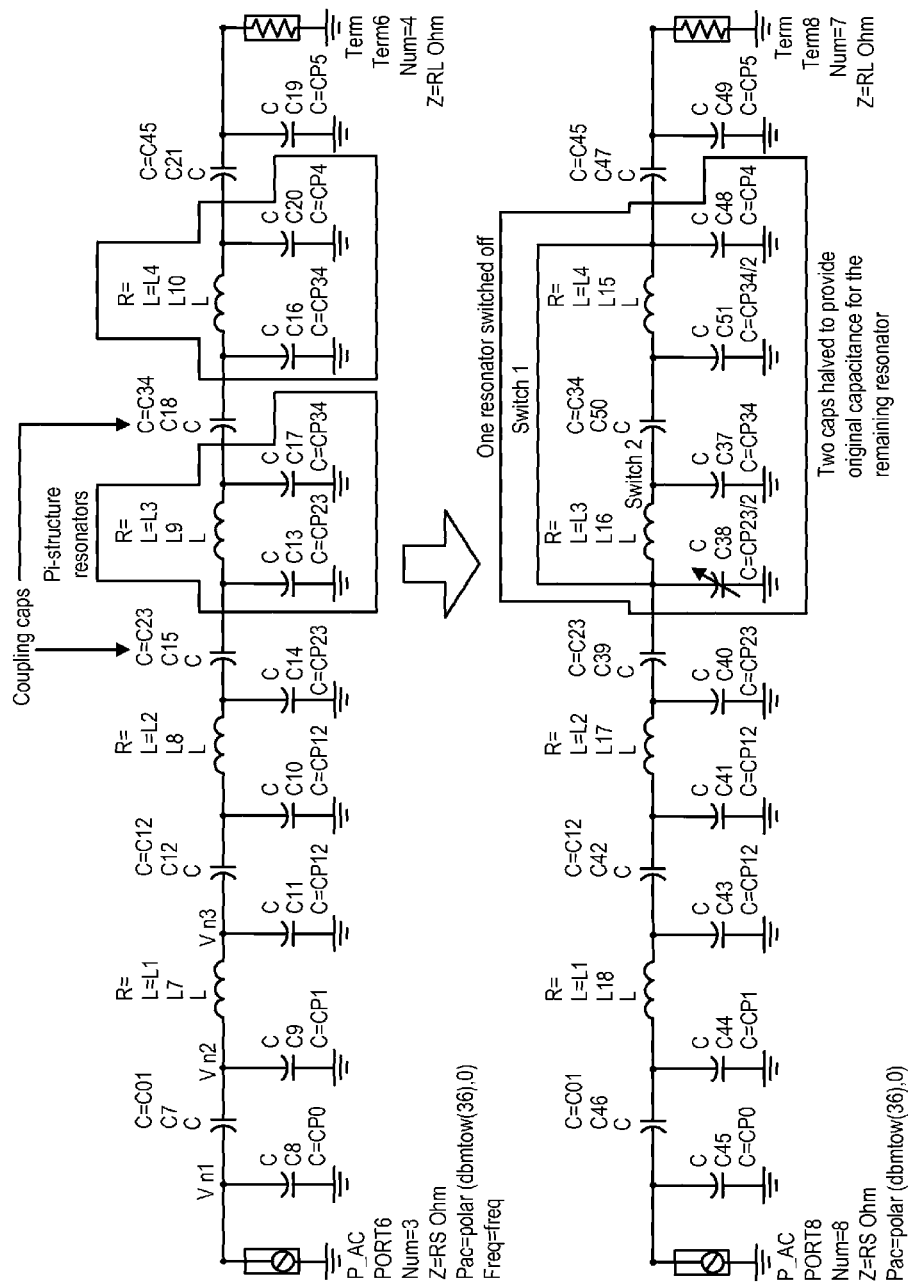
FIGS. 4C-D depicts examples of filter topologies, in accordance with some example embodiments.

FIG. 4C depicts another example filter in which a switch is switch off in order to remove the resonator stage from the filter. The controller 350 may control the switch 1 or 2 to add or remove the resonator stage.

Figure 4D:
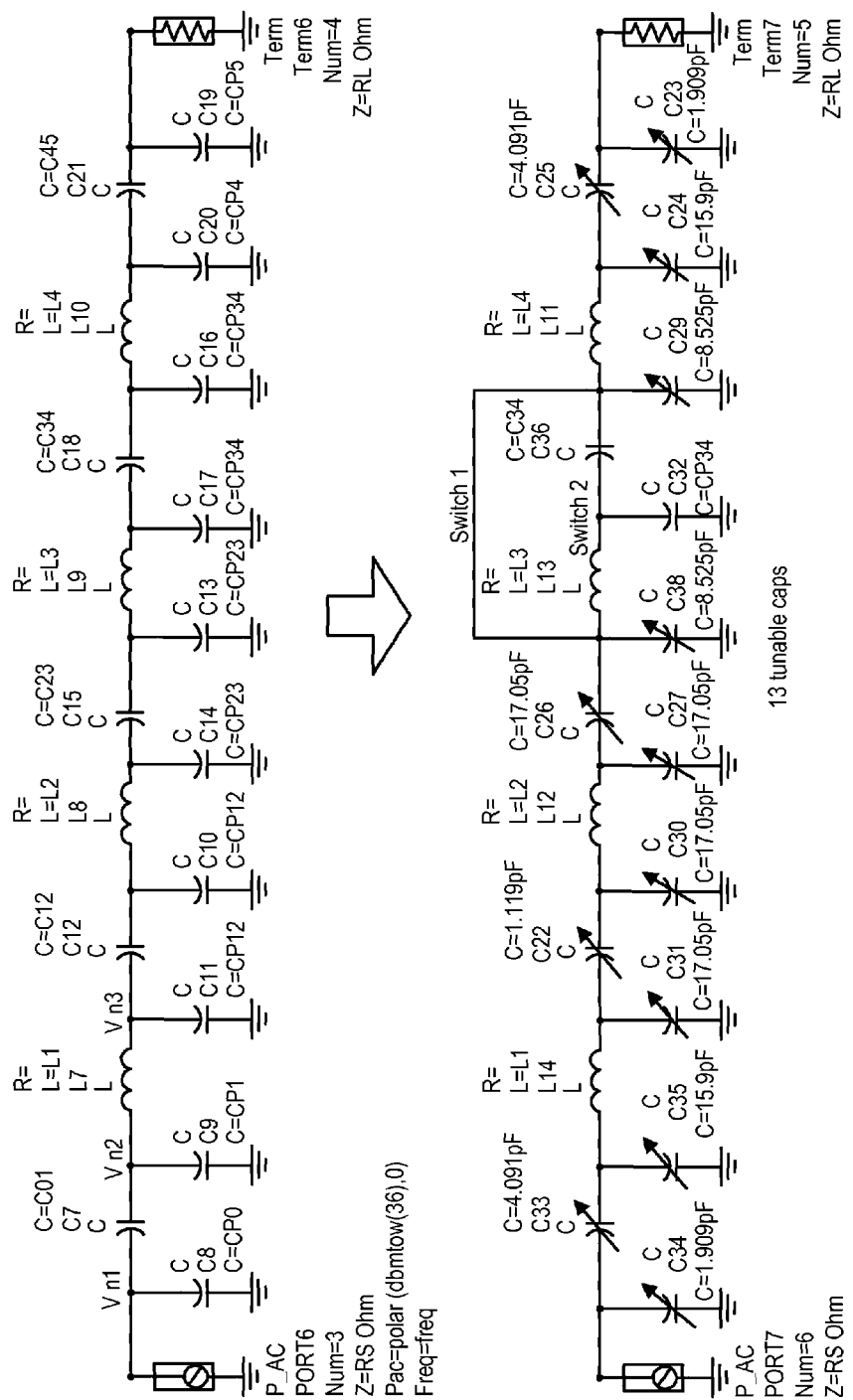

FIG. 4D depicts another example filter in which a switch is switch off in order to remove the resonator stage from the filter. Unlike FIG. 4D the capacitors are tunable (shown with the arrows) under the control of controller 350 for example. Controller 350 may also control the switch 1 or 2 to add or remove the resonator stage.

Figure 5:
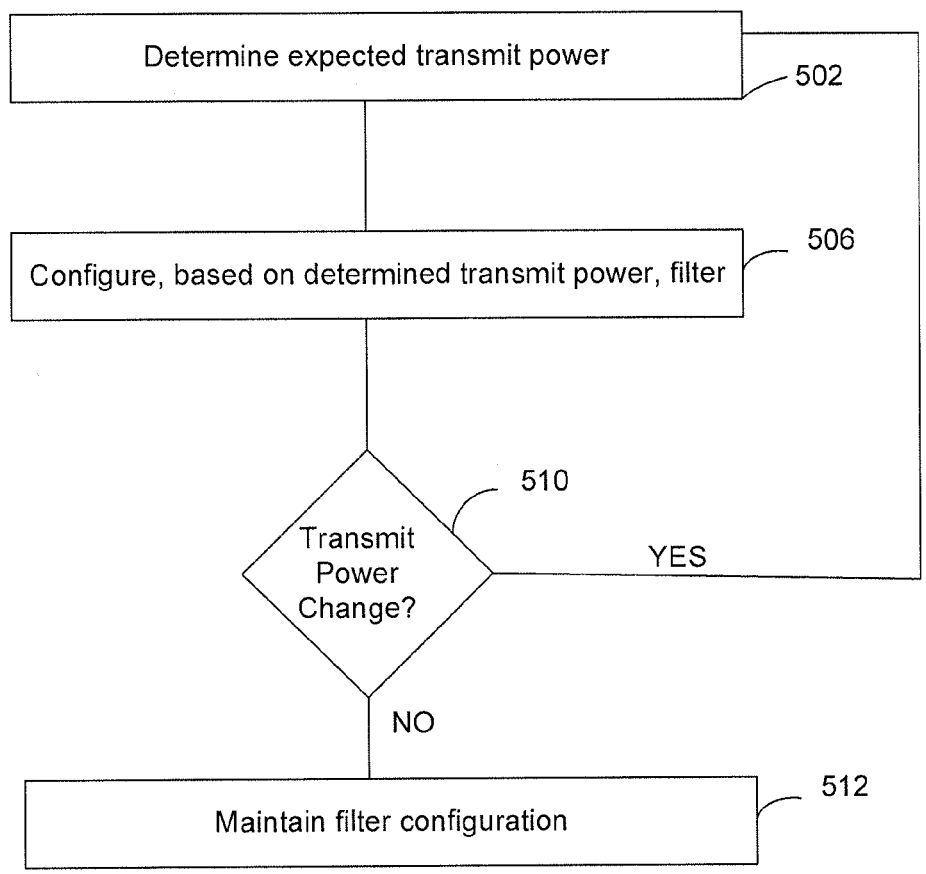
FIG. 5 depicts an example of a process for adjusting the selectivity of a tunable RF filter, in accordance with some example embodiments.

FIG. 5 depicts an example process 500 for adjusting the selectivity of the tunable RF filters disclosed herein. The description of process 500 also refers to FIGS. 2A, 3A, and 3B.

At 502, the expected transmit power may be determined, in accordance with some example embodiments. For example, controller 350 may determine the transmit power directly by performing a measurement, determining a mode/state change at the user equipment, and/or receiving an indication of the transmit power (for example, from a base station) that will be (or is) used at the user equipment. The controller may also determine the amount of received power, such as power from interfering or other strong signals.

At 506, a filter may be configured based on the determined transmit power, in accordance with some example embodiments. For example, controller 350 may change the selectivity and, as such, the stopband suppression of a filter, such as tunable filters 300, 218A, 218B, and/or 252. In some example embodiments, the filter's resonator circuits may be switched in (or out) by switches 312A-E for example based on transmit power and/or receiver self-interference. For example, as the transmit power at the user equipment increases, the controller may add more stages, as noted above with respect to the FIGS. 3A-3B examples, to increase the selectivity of the filter and thus the stopband suppression. However, when the transmit power is lower (which can be the normal operating mode for a user equipment), controller 350 may configure the filter to have fewer resonator stages. As such, the tunable filter is configured to effectively vary the attenuation provided at the adjacent stopband(s) by virtue of changing the selectivity/roll off for example. This may also reduce the insertion loss, which can improve the receiver performance as well. The controller may configure the filter based on the determined amount of received power.

At 510, the transmit power may be monitored, in accordance with some example embodiments. For example, controller 350 may monitor for a transmit power change, and if so (yes at 510), determine the new power value and configure accordingly. To illustrate further, if the transmit filter is configured as a $5^{th}$ order passband filter and the transmit power drops to a lower operating power, the controller 350 may detect this drop at 510 and then reconfigure the transmit filter from a $5^{th}$ order to a $2^{nd}$ or $3^{rd}$ order passband filter for example. If however, there is no change in the transmit power, the controller 350 may maintain the current filter configuration (no at 510 and 512). The monitoring may include monitoring the amount of received power.

Moreover, controller 350 may also vary the center frequencies of the filter 300 to provide a filter tunable over a range of frequencies.

In some example embodiments, the adjustment of the filter's selectivity and thus stopband suppression may be performed using a look-up table. The look-up table may list one or more transmit power ranges and corresponding filter configurations. For example, the look-up table may define that if the transmit power is at a maximum output power (Pmax), the filter should be configured to have a certain selectivity, such as configured as a $5^{th}$ order bandpass filter. And, if the transmit power is lower than the maximum output power but greater than another threshold power, the filter may be configured to have another selectivity, such as a $4^{th}$ order bandpass; and so forth.

In some example embodiments, the transmitter may be set to a certain output power for a certain duration of time. In LTE for example, the duration may be one subframe (for example, 1 millisecond), although it may be longer in other types of cellular systems. As such, there may a transition period between subframes, when the output power is set according to the commands received from the base station. The switches 312A-E may be configured to adjust the filter 300 within this transition period. Moreover, during this transition period, the transmission may be inhibited, while reception is allowed to be active.

Although some of the examples disclosed herein refer to FDD operation, the tunable RF filters (which may be tunable with respect to the quantity of resonator to tune the Q-factor (or selectivity and/or tunable across frequencies) may be used in TDD as well. For example, a receive filter in the TDD receiver front-end may be used to suppress interfering signals, so that they will not overload the receiver. These interfering signals may be caused by the surrounding radio environment, such as by adjacent wireless transmitters. To illustrate further, in the absence of interfering signals that cause blocking, some or all of the resonator stages can be switched off in order to reduce the passband insertion losses (which may in turn improve sensitivity). If interference is detected at the receiver that needs to be suppressed (or a signal of interest that is too strong with respect to signal power), additional resonator stages may be selected to provide additional selectivity and improve tolerance to the blocking signals. For example, the amount of power of the detected receive signals may be used to determine whether the quantity of resonator stages to include in the filter.

Figure 6:
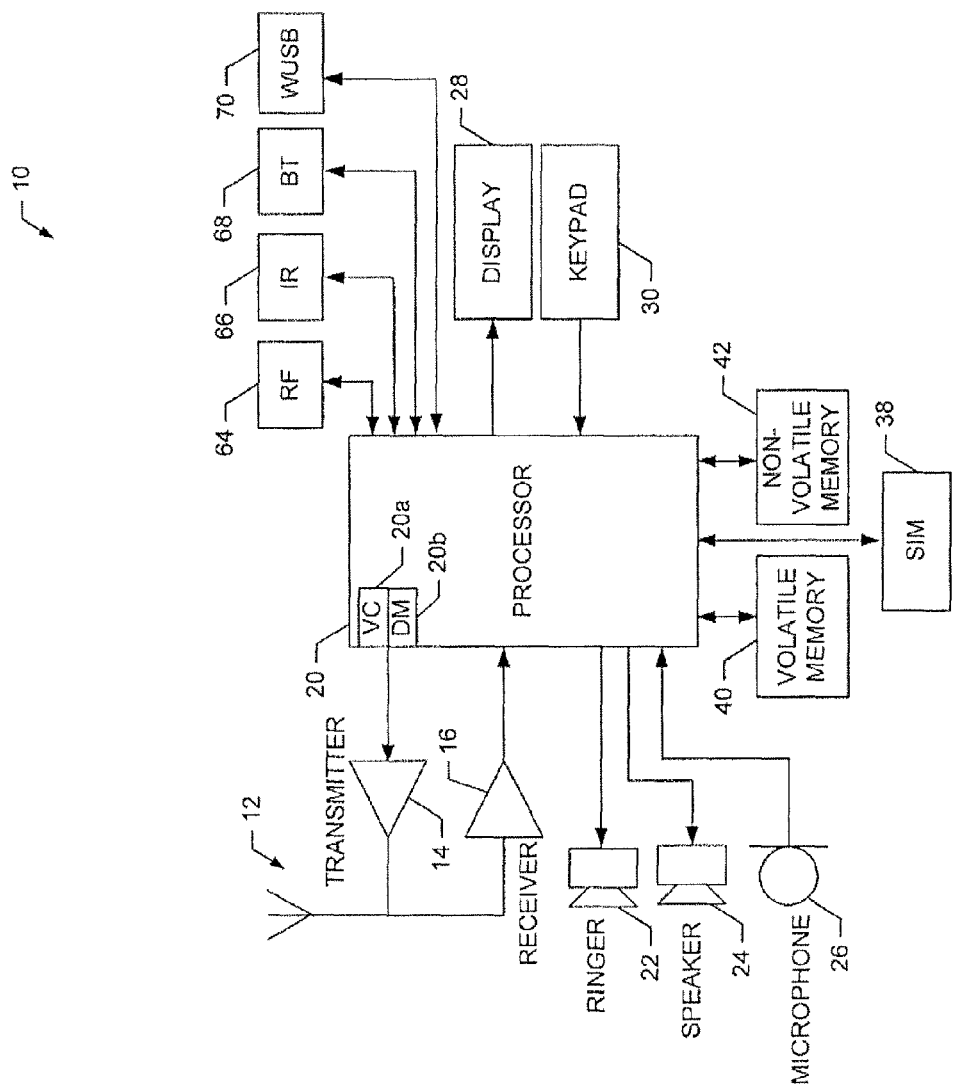
FIG. 6 depicts an example of an apparatus, in accordance with some example embodiments.

FIG. 6 depicts a block diagram of an apparatus 10 such as a user equipment, in accordance with some example embodiments. In some example embodiments, the filters disclosed herein having adjustable selectivity and/or frequency may be implemented at receiver 16 and/or transmitter 14.

The apparatus 10 may include at least one antenna 12 in communication with a transmitter 14 and a receiver 16. Alternatively transmit and receive antennas may be separate.

The apparatus 10 may also include a processor 20 configured to provide signals to and receive signals from the transmitter and receiver, respectively, and to control the functioning of the apparatus. Processor 20 may be configured to control the functioning of the transmitter and receiver by effecting control signaling via electrical leads to the transmitter and receiver. Likewise, processor 20 may be configured to control other elements of apparatus 10 by effecting control signaling via electrical leads connecting processor 20 to the other elements, such as a display or a memory. The processor 20 may, for example, be embodied in a variety of ways including circuitry, at least one processing core, one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits (for example, an application specific integrated circuit (ASIC), a field programmable gate array (FPGA), and/or the like), or some combination thereof. Accordingly, although illustrated in FIG. 6 as a single processor, in some example embodiments the processor 20 may comprise a plurality of processors or processing cores.

Signals sent and received by the processor 20 may include signaling information in accordance with an air interface standard of an applicable cellular system, and/or any number of different wireline or wireless networking techniques, comprising but not limited to Wi-Fi, wireless local access network (WLAN) techniques, such as Institute of Electrical and Electronics Engineers (IEEE) 802.11, 802.16, and/or the like. In addition, these signals may include speech data, user generated data, user requested data, and/or the like.

The apparatus 10 may be capable of operating with one or more air interface standards, communication protocols, modulation types, access types, and/or the like. For example, the apparatus 10 and/or a cellular modem therein may be capable of operating in accordance with various first generation (1G) communication protocols, second generation (2G or 2.5G) communication protocols, third-generation (3G) communication protocols, fourth-generation (4G) communication protocols, fifth-generation (5G) communication protocols, Internet Protocol Multimedia Subsystem (IMS) communication protocols (for example, session initiation protocol (SIP) and/or any subsequent revisions or improvements to these standards. For example, the apparatus 10 may be capable of operating in accordance with 2G wireless communication protocols IS-136, Time Division Multiple Access TDMA, Global System for Mobile communications, GSM, IS-95, Code Division Multiple Access, CDMA, and/or the like. In addition, for example, the apparatus 10 may be capable of operating in accordance with 2.5G wireless communication protocols General Packet Radio Service (GPRS), Enhanced Data GSM Environment (EDGE), and/or the like. Further, for example, the apparatus 10 may be capable of operating in accordance with 3G wireless communication protocols, such as Universal Mobile Telecommunications System (UMTS), Code Division Multiple Access 2000 (CDMA2000), Wideband Code Division Multiple Access (WCDMA), Time Division-Synchronous Code Division Multiple Access (TD-SCDMA), and/or the like. The apparatus 10 may be additionally capable of operating in accordance with 3.9G wireless communication protocols, such as Long Term Evolution (LTE), Evolved Universal Terrestrial Radio Access Network (E-UTRAN), and/or the like. Additionally, for example, the apparatus 10 may be capable of operating in accordance with 4G wireless communication protocols, such as LTE Advanced, LTE-Direct, LTE-Unlicensed, and/or the like as well as similar wireless communication protocols that may be subsequently developed.

It is understood that the processor 20 may include circuitry for implementing audio/video and logic functions of apparatus 10. For example, the processor 20 may comprise a digital signal processor device, a microprocessor device, an analog-to-digital converter, a digital-to-analog converter, and/or the like. Control and signal processing functions of the apparatus 10 may be allocated between these devices according to their respective capabilities. The processor 20 may additionally comprise an internal voice coder (VC) 20a, an internal data modem (DM) 20b, and/or the like. For example, the PND may provide voice commands to enable voice-guided navigation. Further, the processor 20 may include functionality to operate one or more software programs, which may be stored in memory. In general, processor 20 and stored software instructions may be configured to cause apparatus 10 to perform actions. For example, processor 20 may be capable of operating a connectivity program, such as a web browser. The connectivity program may allow the apparatus 10 to transmit and receive web content, such as location-based content, according to a protocol, such as wireless application protocol, WAP, hypertext transfer protocol, HTTP, and/or the like.

Apparatus 10 may also comprise a user interface including, for example, an earphone or speaker 24, a ringer 22, a microphone 26, a display 28, a user input interface, and/or the like, which may be operationally coupled to the processor 20. The display 28 may, as noted above, include a touch sensitive display, where a user may touch and/or gesture to make selections, enter values, and/or the like. The processor 20 may also include user interface circuitry configured to control at least some functions of one or more elements of the user interface, such as the speaker 24, the ringer 22, the microphone 26, the display 28, and/or the like. The processor 20 and/or user interface circuitry comprising the processor 20 may be configured to control one or more functions of one or more elements of the user interface through computer program instructions, for example, software and/or firmware, stored on a memory accessible to the processor 20, for example, volatile memory 40, non-volatile memory 42, and/or the like. The apparatus 10 may include a battery for powering various circuits related to the mobile terminal, for example, a circuit to provide mechanical vibration as a detectable output. The user input interface may comprise devices allowing the apparatus 20 to receive data, such as a keypad 30 (which can be a virtual keyboard presented on display 28 or an externally coupled keyboard) and/or other input devices.

As shown in FIG. 6, apparatus 10 may also include one or more mechanisms for sharing and/or obtaining data. The apparatus 10 may also include for example short-range radio frequency (RF) transceiver and/or interrogator 64, so data may be shared with and/or obtained from electronic devices in accordance with RF techniques. The apparatus 10 may include other short-range transceivers, such as an infrared (IR) transceiver 66, a Bluetooth™ (BT) transceiver 68 operating using Bluetooth™ wireless technology, a wireless universal serial bus (USB) transceiver 70, a Bluetooth™ Low Energy transceiver, a ZigBee transceiver, an ANT transceiver, a cellular device-to-device transceiver, a wireless local area link transceiver, and/or any other short-range radio technology. Apparatus 10 and, in particular, the short-range transceiver may be capable of transmitting data to and/or receiving data from electronic devices within the proximity of the apparatus, such as within 10 meters, for example. The apparatus 10 including the Wi-Fi or wireless local area networking modem may also be capable of transmitting and/or receiving data from electronic devices according to various wireless networking techniques, including 6LoWpan, Wi-Fi, Wi-Fi low power, WLAN techniques such as IEEE 802.11 techniques, IEEE 802.15 techniques, IEEE 802.16 techniques, and/or the like.

The apparatus 10 may comprise memory, such as a subscriber identity module (SIM) 38, a removable user identity module (R-UIM), a eUICC, an UICC, and/or the like, which may store information elements related to a mobile subscriber. In addition to the SIM, the apparatus 10 may include other removable and/or fixed memory. The apparatus 10 may include volatile memory 40 and/or non-volatile memory 42. For example, volatile memory 40 may include Random Access Memory (RAM) including dynamic and/or static RAM, on-chip or off-chip cache memory, and/or the like. Non-volatile memory 42, which may be embedded and/or removable, may include, for example, read-only memory, flash memory, magnetic storage devices, for example, hard disks, floppy disk drives, magnetic tape, optical disc drives and/or media, non-volatile random access memory (NVRAM), and/or the like. Like volatile memory 40, non-volatile memory 42 may include a cache area for temporary storage of data. At least part of the volatile and/or non-volatile memory may be embedded in processor 20. The memories may store one or more software programs, instructions, pieces of information, data, and/or the like which may be used by the apparatus to provide the operations disclosed herein including process 500, and/or the like.

The memories may comprise an identifier, such as an international mobile equipment identification (IMEI) code, capable of uniquely identifying apparatus 10. The functions may include the operations disclosed herein including the following: controlling the configuration of the filter to vary the selectivity and suppression based on measured transmit power and/or receiver self-interference. In the example embodiment, the processor 20 may be configured using computer code stored at memory 40 and/or 42 to perform operations as disclosed herein with respect to process 500 and/or the like.

Some of the embodiments disclosed herein may be implemented in software, hardware, application logic, or a combination of software, hardware, and application logic. The software, application logic, and/or hardware may reside on memory 40, the control apparatus 20, or electronic components, for example. In some example embodiment, the application logic, software or an instruction set is maintained on any one of various conventional computer-readable media. In the context of this document, a "computer-readable medium" may be any non-transitory media that can contain, store, communicate, propagate or transport the instructions for use by or in connection with an instruction execution system, apparatus, or device, such as a computer or data processor circuitry, with examples depicted at FIG. 6, computer-readable medium may comprise a non-transitory computer-readable storage medium that may be any media that can contain or store the instructions for use by or in connection with an instruction execution system, apparatus, or device, such as a computer.

Without in any way limiting the scope, interpretation, or application of the claims appearing herein, a technical effect of one or more of the example embodiments disclosed herein may include improved transmitter power efficiency and/or receiver sensitivity.

The subject matter described herein may be embodied in systems, apparatus, methods, and/or articles depending on the desired configuration. For example, the base stations and user equipment (or one or more components therein) and/or the processes described herein can be implemented using one or more of the following: a processor executing program code, an application-specific integrated circuit (ASIC), a digital signal processor (DSP), an embedded processor, a field programmable gate array (FPGA), and/or combinations thereof. These various implementations may include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device. These computer programs (also known as programs, software, software applications, applications, components, program code, or code) include machine instructions for a programmable processor, and may be implemented in a high-level procedural and/or object-oriented programming language, and/or in assembly/machine language. As used herein, the term "computer-readable medium" refers to any computer program product, machine-readable medium, computer-readable storage medium, apparatus and/or device (for example, magnetic discs, optical disks, memory, Programmable Logic Devices (PLDs)) used to provide machine instructions and/or data to a programmable processor, including a machine-readable medium that receives machine instructions. Similarly, systems are also described herein that may include a processor and a memory coupled to the processor. The memory may include one or more programs that cause the processor to perform one or more of the operations described herein.

Although a few variations have been described in detail above, other modifications or additions are possible. In particular, further features and/or variations may be provided in addition to those set forth herein. Moreover, the implementations described above may be directed to various combinations and subcombinations of the disclosed features and/or combinations and subcombinations of several further features disclosed above. Other embodiments may be within the scope of the following claims.

The different functions discussed herein may be performed in a different order and/or concurrently with each other. Furthermore, one or more of the above-described functions may be optional or may be combined. Although various aspects of the invention are set out in the independent claims, other aspects of the invention comprise other combinations of features from the described embodiments and/or the dependent claims with the features of the independent claims, and not solely the combinations explicitly set out in the claims. It is also noted herein that while the above describes example embodiments of the invention, these descriptions should not be viewed in a limiting sense. Rather, there are several variations and modifications, which may be made without departing from the scope of the present invention as, defined in the appended claims. The term "based on" includes "based on at least."

What is claimed:

1. An apparatus comprising:
    a transmit radio frequency filter comprising a plurality of first resonant circuit filter stages, each of the plurality of first resonant circuit filter stages configured to be switched in or out of the transmit radio frequency filter to vary at least a selectivity of the transmit radio frequency filter; and
    a receive radio frequency filter comprising a plurality of second resonant circuit filter stages, each of the plurality of second resonant circuit filter stages configured to be switched in or out of the receive radio frequency filter to vary at least a selectivity of the receive radio frequency filter;
    wherein the selectivity of the transmit radio frequency filter and the selectivity of the receive radio frequency filter is varied based on at least one of a first amount of transmit power being used at a user equipment and a second amount of received signal power.

2. The apparatus of claim 1, wherein the selectivity of the transmit radio frequency filter suppresses transmit signals in a first stopband that overlaps with a receive radio frequency filter passband, and wherein the selectivity of the receive radio frequency filter suppresses received signals in a second stopband that overlaps with a transmit radio frequency filter stopband, when the user equipment is in a high power transmission state.

3. The apparatus of claim 1, wherein one or more of the plurality of first resonant circuit filter stages and one or more of the plurality of second resonant circuit filter stages are not selected, when the user equipment is in a low power transmission state.

4. The apparatus of claim 1, wherein each of the transmit radio frequency filter and the receive radio frequency filter comprise a tunable radio frequency bandpass filter, a tunable duplex filter, a tunable radio frequency lowpass filter, a tunable radio frequency highpass filter, or any combination thereof.

5. The apparatus of claim 1, wherein the transmit radio frequency filter comprises an output and an input, wherein the output is coupled to an antenna and the input is coupled to a power amplifier.

6. The apparatus of claim 1, wherein the receive radio frequency filter comprises an output and an input, wherein the input is coupled to an antenna and the output is coupled to a low noise amplifier.

7. The apparatus of claim 1, further comprising:
    a controller configured to at least determine the first amount of transmit power and select, based on the first amount, a first designation of switched in or out for each of the plurality of first resonant circuit filter stages; and/or determine the second amount of received power and select, based on the second amount, a second designation of switched in or out for each of the plurality of second resonant circuit filter stages.

8. The apparatus of claim 7, wherein the transmit power is determined from an indication sent by a base station to the user equipment.

9. The apparatus of claim 7, wherein the controller selects one or more of the plurality of second resonant circuit filter stages to be switched in when transmission is inhibited and reception is enabled.

10. The apparatus of claim 7, wherein the controller selects the first designation of switched in or out for each of the plurality of first resonant circuit filter stages based on a comparison of the first amount of transmit power to a plurality of threshold transmit powers, wherein the threshold transmit powers are mapped to a corresponding selectivity required at the transmit radio frequency filter.

11. The apparatus of claim 1, wherein each of the plurality of first resonant circuit filter stages and the plurality of second resonant circuit filter stages comprise at least one of an inductor, a capacitor, and an acoustic wave filter.

12. The apparatus of claim 1, wherein one or more of the plurality of first resonant circuit filter stages and the plurality of second resonant circuit filter stages comprise at least one inductor in series with at least one capacitor.

13. The apparatus of claim 1, wherein one or more of the plurality of first resonant circuit filter stages and the plurality of second resonant circuit filter stages comprise at least one inductor in parallel with at least one capacitor.

14. The apparatus of claim 13, wherein one or more of the plurality of first resonant circuit filter stages and the plurality of second resonant circuit filter stages is coupled in series to at least one coupling capacitor.

15. The apparatus of claim 14, wherein the at least one capacitor and the at least one coupling capacitor include at least one variable capacitor under the control of the controller.

16. The apparatus of claim 1, wherein a high power transmission state transmits at a higher power than a low power transmit state.

17. A method comprising:
    varying at least a selectivity of a transmit radio frequency filter comprising a plurality of first resonant circuit filter stages, each of the plurality of first resonant circuit filter stages configured to be switched in or out of the transmit radio frequency filter, by at least switching in or out each of the plurality of first resonant circuit filter stages;
    varying at least a selectivity of a receive radio frequency filter comprising a plurality of second resonant circuit filter stages, each of the plurality of second resonant circuit filter stages configured to be switched in or out of the receive radio frequency filter, by at least switching in or out each of the plurality of second resonant circuit filter stages;

wherein a selectivity of the transmit radio frequency filter and a selectivity of the receive radio frequency filter is varied based on at least one of a first amount of transmit power being used at a user equipment and a second amount of received signal power.

18. The method of claim 17, wherein the selectivity of the transmit radio frequency filter suppresses transmit signals in a first stopband that overlaps with a receive radio frequency filter passband, and wherein the selectivity of the receive radio frequency filter suppresses received signals in a second stopband that overlaps with a transmit radio frequency filter stopband, when the user equipment is in a high power transmission state.

19. The method of claim 17, wherein one or more of the plurality of first resonant circuit filter stages and one or more of the plurality of second resonant circuit filter stages are not selected, when the user equipment is in a low power transmission state.

* * * * *